(12) United States Patent
Choi et al.

(10) Patent No.: US 6,271,124 B1
(45) Date of Patent: Aug. 7, 2001

(54) METHOD OF MAKING A DYNAMIC RANDOM ACCESS MEMORY DEVICE UTILIZING CHEMICAL MECHANICAL POLISHING

(75) Inventors: Jin-Gyoo Choi, Kyonggi-do; Jun-Yong Noh, Inchon-Kwangyokshi, both of (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/395,291

(22) Filed: Sep. 13, 1999

(30) Foreign Application Priority Data

Dec. 29, 1997 (KR) .................................................. 97-75999

(51) Int. Cl.⁷ .................................................. H01L 21/44
(52) U.S. Cl. .......................... 438/633; 438/626; 438/692; 438/253; 438/254; 438/396; 438/397
(58) Field of Search .................................. 438/626, 633, 438/692, 253, 254, 396, 397

(56) References Cited

U.S. PATENT DOCUMENTS 5,627,094 * 5/1997 Chan et al. ........................ 438/253
5,885,866 * 3/1999 Chen ................................. 438/253
5,953,608 * 9/1999 Hirota ............................... 438/253
6,071,773 * 6/2000 Lee et al. ........................... 438/253

FOREIGN PATENT DOCUMENTS

0186081 * 8/1995 (KR) .

* cited by examiner

Primary Examiner—John F. Niebling
Assistant Examiner—Jennifer M. Kennedy
(74) Attorney, Agent, or Firm—Marger Johnson & McCollom, P.C.

(57) ABSTRACT

A semiconductor memory device with a capacitor-over-bitline (COB) structure and a method for fabricating the same. The semiconductor memory device includes a transistor having a gate electrode formed on a gate insulating layer on a semiconductor substrate and having source and drain regions formed on the surface of the substrate and separated from each other by the gate electrode, a first interlayer insulating layer formed over the substrate including the transistor; a bitline formed over the first interlayer insulating layer; and a second interlayer insulating layer formed over the substrate including the bitline, for insulating the bitline from a storage node of a capacitor. A surface of the second interlayer insulating layer is planarized by a chemical-mechanical polishing (CMP) process so as to be substantially parallel to a surface of the substrate including the bitline.

1 Claim, 4 Drawing Sheets

METHOD OF MAKING A DYNAMIC RANDOM ACCESS MEMORY DEVICE UTILIZING CHEMICAL MECHANICAL POLISHING

BACKGROUND OF THE INVENTION

1. Field of the Invention

The present invention relates to a semiconductor memory device and a method for fabricating the same, and more particularly, to a dynamic random access memory (DRAM) device with a capacitor-over-bitline structure which can improve a global unevenness on a wafer by a chemical-mechanical polishing process and a method for fabricating the same.

2. Description of the Related Art

With the high integration of a DRAM device, a reduction of a cell in size is inevitable. As the area of the cell is reduced, it is important to ensure the capacitance of a capacitor. Various approaches have been tried to ensure the capacitance of the capacitor for reducing the thickness of a dielectric film using a material having a high dielectric constant as the dielectric film, or increasing the area of a storage node. As another means of increasing the capacitance of the capacitor, an initial plane cell capacitor structure can be changed to a stacked or trench capacitor structure. In the stacked capacitor structure, the effective area of the storage node, can be increased by utilization of a cylindrical capacitor or a fin type capacitor.

A capacitor-under-bitline (CUB) structure is one in which the capacitor is formed before the bitline is formed. This structure can be changed to a capacitor-over-bitline (COB) structure in which the capacitor is formed after the bitline is formed. The COB structure has the superior advantage of increasing the capacitance of the capacitor within a limited area because it is possible to form the capacitor irrespective of a margin of a bitline process. Since the COB structure has the capacitor formed over the bitline, the size of the storage node can be maximized, and is limited only by the lithography process, and thus the large capacitance of the capacitor can be ensured.

Referring to FIG. 1, there is shown a DRAM device with a conventional COB structure before the capacitor is formed. A gate electrode 16 of a transistor is formed together with a gate insulating layer 14 over a semiconductor substrate 10 in which an active region and an isolation region are distinguished by a field oxide layer 12. Source and drain regions 18 of the transistor are formed on substrate 10 on both sides of the gate electrode 16. An insulating layer 20 with a self-aligned contact exposing the source and drain regions 18 is formed over substrate 10, and transistor. A pad conductive layer 22 of an impurity-doped polysilicon layer is formed on the self-aligned contact. Generally, since the COB structure has the transistor, the bitline and an interlayer insulating layer formed under the storage node, an aspect ratio of a buried contact for electrically connecting the storage node to the source region of the transistor is increased. Therefore, the contact may be not opened. In order to easily form the buried contact and a bitline contact for electrically connecting the drain region of the transistor with the bitline, the conductive layer 22 serving as a landing pad is formed on the active region, that is, the source and drain regions of the transistor. Thus, the aspect ratios of the contacts are reduced.

A first interlayer insulating layer 24 consisting of an insulating material such as an oxide layer is then formed over the substrate 10 including the pad conductive layer 22. The first interlayer insulating layer 24 insulates the transistor from the bitline and has the bitline contact (not shown) exposing the drain region of the transistor. A bitline 26 connected with the drain region of the transistor through the bitline contact is formed on the first interlayer insulating layer 24. A second interlayer insulating layer 28 of the insulating material such as a BPSG (borophosphosilicate glass) is formed on the bitline 26. The second interlayer insulating layer 28 insulates the bitline from the storage node of the capacitor. The second interlayer insulating layer 28 is planarized by an etch-back process. Although not shown in the drawing, the storage node of the capacitor is formed on the second interlayer insulating layer 28. In this case, since the storage node is formed only on a memory cell region, the height of the boundary between the memory cell region and a peripheral region is high. That is, since the storage node is not formed on the peripheral region for driving the cell and a core region for connecting blocks of the cell with each other, the memory cell region, the core region and the peripheral region greatly differ in their absolute height. When the height of the storage node becomes higher in order to increase the capacitance, it is difficult to adjust a focus of any one of the memory cell region, the core region and the peripheral region in a subsequent exposing process for forming a contact and a metal wire because the respective focuses of those regions differ from each other.

Before the storage node of the capacitor is formed, there is a difference "a" in the height between the memory cell region, the core region and the peripheral region due to the transistor and the bitline 26, as indicated in FIG. 1. If the capacitor is formed over the substrate, the difference in height between the memory cell region, the core region and the peripheral region will be larger. Therefore, it is very difficult to ensure the margin of depth of the focus in a subsequent exposing process.

To solve such a focus problem, the region having the lowest height should be raised. As one example, there is a method for depositing an oxide-series layer to a considerably thick thickness and etching the layer to fill a portion having the difference in height. Although this method has the effect of reducing the difference in height between adjacent regions (hereinafter, this difference is referred to as the local unevenness), it has little effect on the reduction of the difference in height between regions having a width equal to twice or more wider than the thickness of the deposited oxide-series layer (hereinafter, this difference is referred to as the global unevenness).

As another method, a flowable film such as a spin-on glass (SOG) is used. However, there can be quality problems in the film, a problem related to a subsequent processes, etc. A method for covering a region having low height with a photoresist and etching a higher region may be also used. However, this method has a disadvantage in that it includes a number of additional process steps, and thus it is difficult to apply that method to mass production.

SUMMARY OF THE INVENTION

It is therefore an object of the present invention to provide a semiconductor memory device with a COB structure, which can improve a global unevenness on a wafer by using a chemical-mechanical polishing process.

It is another object of the present invention to provide a method for fabricating the above-described semiconductor memory device.

In one aspect of the present invention, there is provided a semiconductor memory device with a capacitor-over-bitline structure including: a transistor having a gate electrode formed on a gate insulating layer on a semiconductor substrate and having source and drain regions formed on the surface of the substrate and separated from each other by the gate electrode; a first interlayer insulating layer formed over the substrate and transistor; a bitline formed over the first interlayer insulating layer; and a second interlayer insulating layer formed over the substrate and the bitline for insulating the bitline from a storage node of a capacitor; whereby a surface of the second interlayer insulating layer is planarized by a chemical-mechanical polishing (CMP) process so as to be substantially parallel to a surface of the substrate including the bitline. Preferably, the semiconductor memory device further includes an insulating layer formed on the second interlayer insulating layer. Preferably, the first interlayer insulating layer has a contact for connecting the drain region of the transistor with the bitline.

In another aspect of the present invention, a method for fabricating a semiconductor memory device with a capacitor-over-bitline structure includes the steps of: forming a transistor consisting of a gate, a source and a drain on a semiconductor substrate; forming a first interlayer insulating layer over the substrate and the transistor; forming a bitline over the first interlayer insulating layer; forming a second interlayer insulating layer for insulating the bitline from a storage node of a capacitor over the substrate and the bitline; and planarizing a surface of the second interlayer insulating layer by a chemical-mechanical polishing (CMP) process. The chemical-mechanical polishing (CMP) process is preferably implemented until a surface of the bitline is exposed. It is also preferable that an insulating layer is formed over a resultant structure after a surface of the second interlayer insulating layer is planarized. Preferably, a contact for exposing the drain of the transistor is formed before the bitline is formed by etching the first interlayer insulating layer.

In still another aspect of the present invention, a method for fabricating a semiconductor memory device with a capacitor-over-bitline structure includes the steps of: forming a transistor consisting of a gate, a source and a drain over a semiconductor substrate; forming a first interlayer insulating layer over the substrate and the transistor; forming a bitline on the first interlayer insulating layer; forming a second interlayer insulating layer over the substrate and the bitline for insulating the bitline from a storage node of a capacitor; planarizing a surface of the second interlayer insulating layer by a chemical-mechanical polishing (CMP) process until a surface of the bitline is exposed; and forming an insulating layer over a resultant structure.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 2:
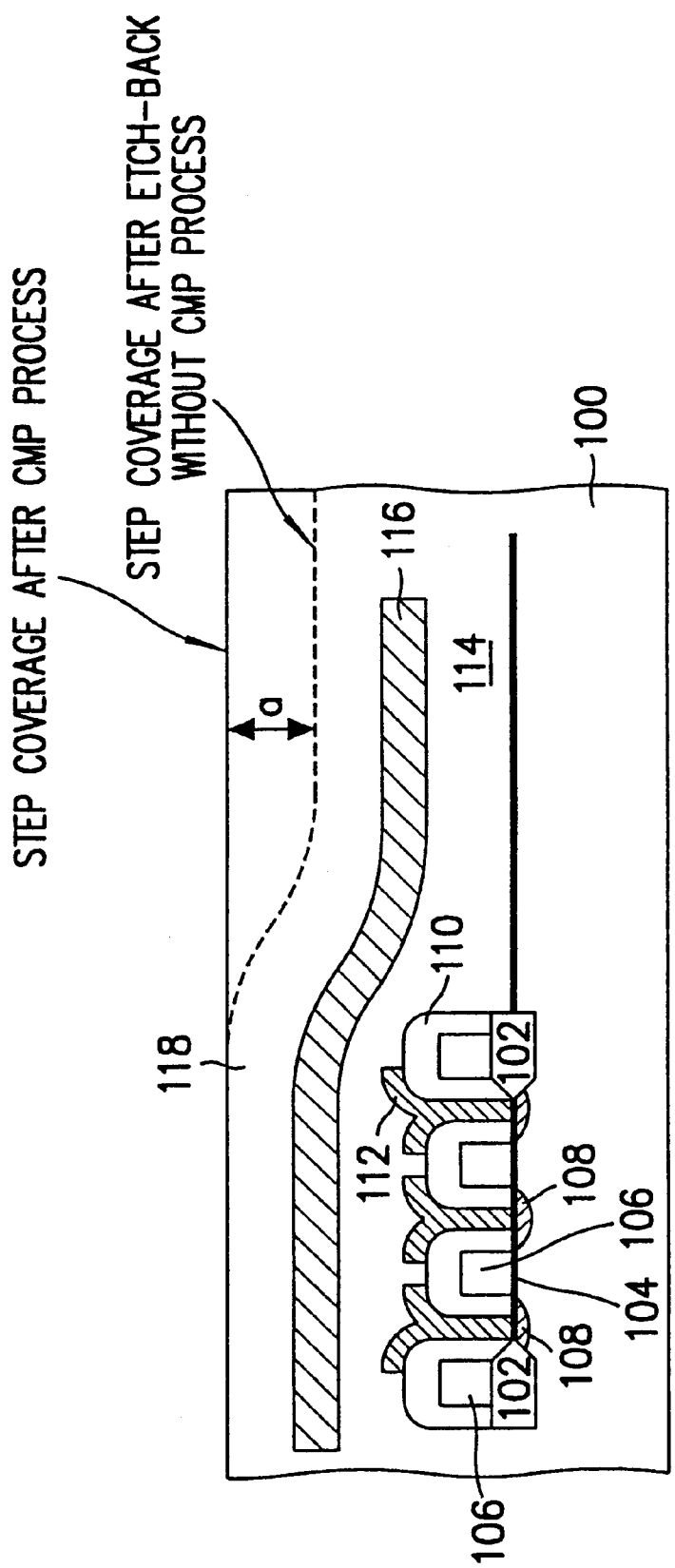
FIG. 2 is a cross-sectional view for describing a fabricating process of a DRAM device according to a preferred embodiment of the present invention.

Referring to FIG. 2, a field oxide layer 102 is formed on a semiconductor substrate 100 by a typical isolation process to define an active region and an isolation region on substrate 100 into. A gate insulating layer 104 and a gate electrode 106 are sequentially formed on the active region of the substrate 100. Source and drain regions 108 are formed of the substrate surface of both sides of the gate electrode 106 by a typical ion implanting process, thereby forming a transistor.

An insulating layer 110 is formed over the substrate 100 and the transistor. The insulating layer 110 is anisotropically etched to form a self-aligned contact exposing the source and drain regions 108 of the transistor. A conductive material for example, an impurity-doped polysilicon, is deposited over the resultant structure. The polysilicon is then patterned by a photolithographic process to form a pad conductive layer 112 connected with the source and drain regions 108 of the transistor through the self-aligned contact. The pad conductive layer 112 is used as a landing pad for reducing an aspect ratio of a bitline contact and an aspect ratio of a buried contact. The bitline contact connects the drain region of the transistor with a bitline to be formed in a subsequent process. The buried contact connects the source region of the transistor with a storage node of a capacitor to be formed in a subsequent process.

An insulating material such as an oxide layer is deposited over the resultant structure including the pad conductive layer 112 to form a first interlayer insulating layer 114 for insulating the transistor from the bitline to be formed in a subsequent process. The first interlayer insulating layer 114 is etched by the photolithographic process to form the bitline contact (not shown) exposing the drain region of the transistor. A conductive material is deposited over the resultant structure including the bitline contact. The conductive material is patterned by the photolithographic process to form a bitline 116. The bitline 116 is connected with the drain region of the transistor through the bitline contact.

An insulating material such as a BPSG is deposited over the resultant structure including the bitline 116 to form a second interlayer insulating layer 118 for insulating the bitline 116 from the storage node of the capacitor which is formed in a subsequent process. In this case, the second interlayer insulating layer 118 is deposited to a thickness of 3 or 4 times the target thickness. The second interlayer insulating layer 118 is polished by a chemical-mechanical polishing (CMP) process to planarize its surface. The CMP process polishes the surface of a chip by a chemical component within a slurry and a mechanical component of a polishing pad and a polish. By the CMP process, a global planarization of a wide region and a low-temperature planarization, which cannot be achieved by a reflow process or an etch-back process, can be accomplished. Although not shown in the drawing, the storage node of the capacitor is formed over the second interlayer insulating layer 118.

In FIG. 2, dotted lines show a step coverage, which results when the second interlayer insulating layer 118 is etched without practicing the CMP process. Solid lines show a step coverage when layer 118 is planarized by the CMP process.

Figure 1:
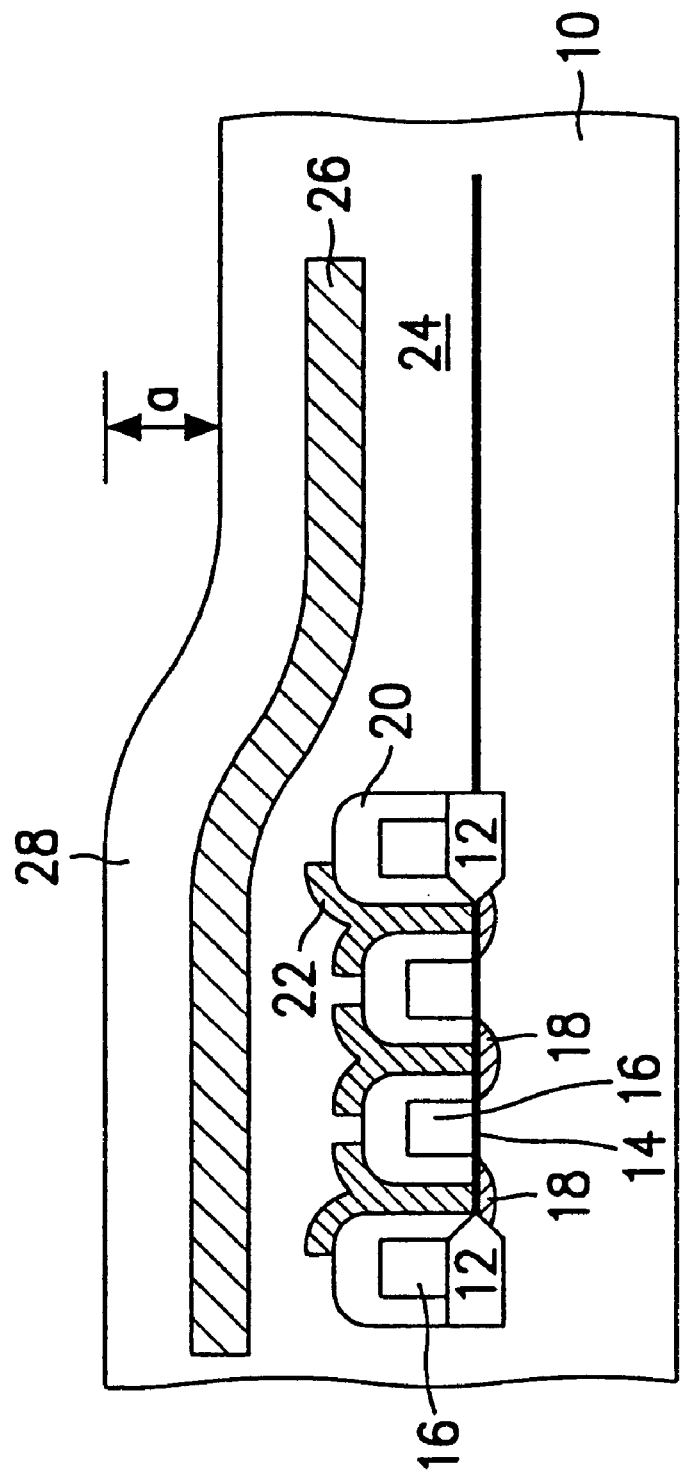
FIG. 1 is a cross-sectional view of a DRAM device with a conventional COB structure.
Figure 3:
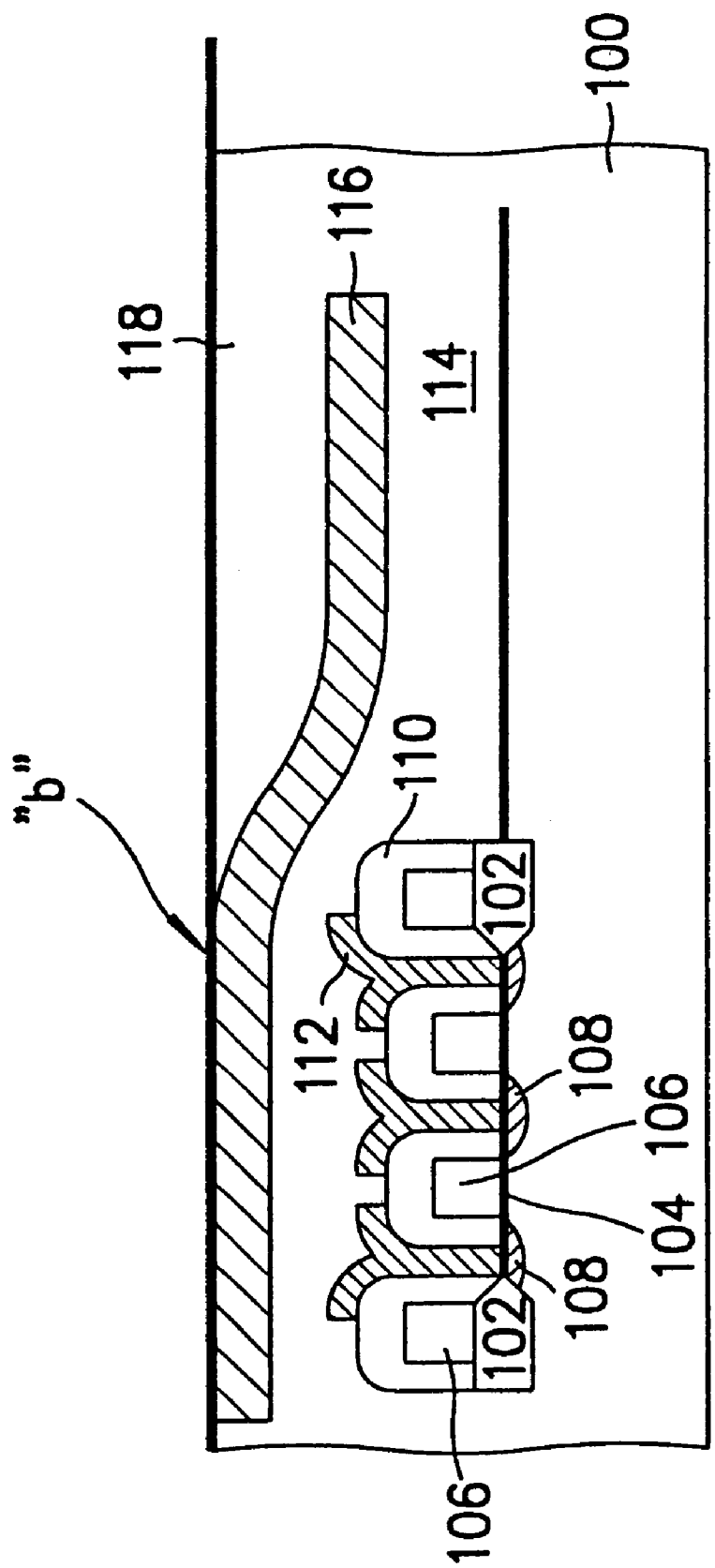
FIGS. 3 and 4 are cross-sectional views for describing a fabricating process of a DRAM device according to another preferred embodiment of the present invention.
Figure 4:
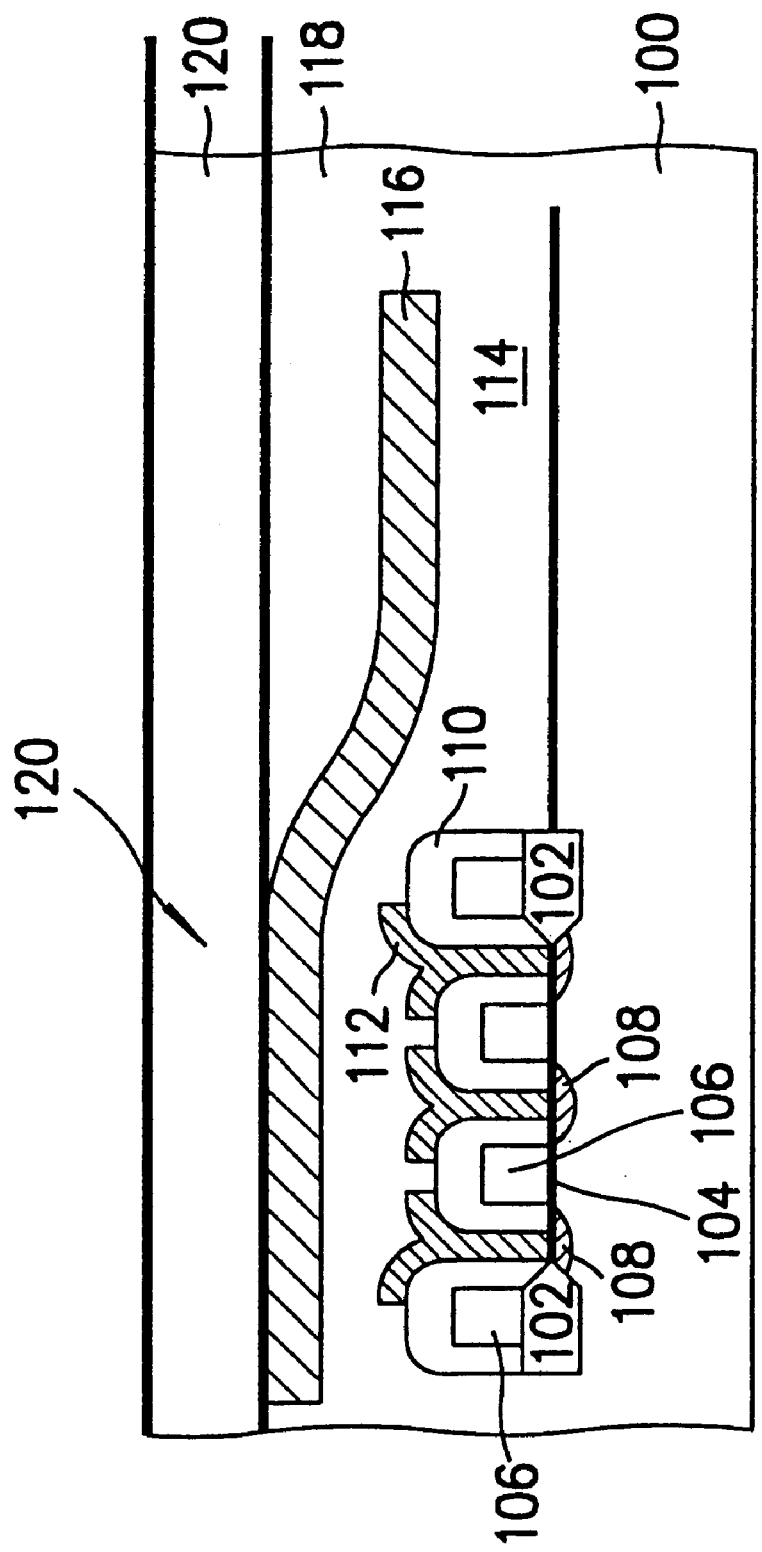

FIGS. 3 and 4 are cross-sectional views for describing a fabricating process of a DRAM device according to another preferred embodiment of the present invention. Referring to FIG. 3, the transistor, the first interlayer insulating layer 114 and the bitline 116 are formed by the method described with reference to FIG. 1. The insulating layer, e.g. BPSG, is deposited over the resultant structure to form the second interlayer insulating layer 118 for insulating the bitline from the storage node of the capacitor to be formed in a subsequent process. The second interlayer insulating layer 118 is polished by using the CMP process. Generally, the polishing characteristics of the CMP process differ according to the size, density and step coverage of patterns constituting an underlying layer, for example, of an active pattern, the gate electrode, the bitline, etc. In particular, as the density of the underlying structure of a polishing layer becomes denser and as the height of the underlying structure is increased, the damage to the underlying structure is severe. If the second interlayer insulating layer 118 is excessively polished, the bitline 116 formed thereunder may be exposed as indicated by "b" due to a uniformity problem in the CMP process.

If the bitline 116 is exposed, the problem arises with insulating the bitline 116 from the storage node of the capacitor to be formed in a subsequent process occurs. Therefore, an insulating layer 120 is deposited on the second interlayer insulating layer 118, as shown in FIG. 4. Then the exposed bitline 116 is protected by the insulating layer 120, insulating the bitline 116 from the storage node of the capacitor.

As still another preferred embodiment of the present invention, the second interlayer insulating layer 118 is polished by the CMP process until the bitline 116 formed thereunder is exposed. Thereafter, the insulating layer 120 is deposited over the resultant structure to insulate the bitline 116 from the storage node of the capacitor.

As described above, the second interlayer insulating layer 118 is planarized by the CMP process. Alternatively, the second interlayer insulating layer 118 is planarized by the CMP process until the surface of the bitline is exposed, and the insulating layer 120 is additionally deposited, thereby insulating the bitline from the storage node of the capacitor. Therefore, the local unevenness and the global unevenness can be improved, and a focus margin can be ensured during an exposing process for forming a metal wiring.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A method for fabricating a semiconductor memory device with a capacitor-over-bit line structure, comprising the steps of:

forming a first transistor having a first gate electrode and a second transistor having a second gate electrode on a semiconductor substrate; wherein the first and second transistors share a conductive region formed in the substrate between the first and second gate electrodes;

covering the first and second gate electrodes and the conductive region with a first insulating layer;

forming a first opening in the first insulating layer and exposing at least a portion of the conductive region;

forming a conductive pad in communication with the conductive region in the substrate via the first opening;

forming a second insulating layer over the first and second gate electrodes and the conductive pad;

forming a second opening in the second insulating layer and exposing the conductive pad;

forming a conductive stepped bit line over the second insulating layer and in communication with the conductive pad via the second opening, the stepped bit line having a portion above the transistor that is raised relative to the substrate;

depositing a third stepped insulating layer over the second insulating layer and the bit line;

planarizing the third insulating layer and exposing a portion of the bit line using a chemical mechanical polishing step;

forming a fourth insulating layer over the third insulating layer and the exposed portion of the bit line; and forming a capacitor over the fourth insulating layer.

* * * * *

UNITED STATES PATENT AND TRADEMARK OFFICE
CERTIFICATE OF CORRECTION

PATENT NO.    : 6,271,124 B1
DATED         : August 7, 2001
INVENTOR(S)   : Choi et al.

It is certified that error appears in the above-identified patent and that said Letters Patent is hereby corrected as shown below:

<u>Title page,</u>
Item [60], should read -- Continuation of prior application No. 09/212,053, filed on December 15, 1998. --

Signed and Sealed this

Eighth Day of April, 2003

JAMES E. ROGAN
*Director of the United States Patent and Trademark Office*